United States Patent
Surico et al.

(10) Patent No.: US 7,345,921 B2
(45) Date of Patent: Mar. 18, 2008

(54) METHOD AND SYSTEM FOR A PROGRAMMING APPROACH FOR A NONVOLATILE ELECTRONIC DEVICE

(75) Inventors: Stefano Surico, Milan (IT); Simone Bartoli, Cambiago (IT); Fabio Tassan Caser, Arcore Milano (IT); Monica Marziani, Milan (IT)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 11/128,939

(22) Filed: May 12, 2005

(65) Prior Publication Data

US 2006/0077714 A1   Apr. 13, 2006

(30) Foreign Application Priority Data

Oct. 7, 2004  (IT) ................ MI2004A1904

(51) Int. Cl.
*G11C 11/34* (2006.01)
*G11C 16/06* (2006.01)

(52) U.S. Cl. .............. 365/185.22; 365/185.24; 365/185.03; 365/189.07; 365/210

(58) Field of Classification Search .......... 365/185.22, 365/185.24, 185.03, 185.2, 210, 189.07
See application file for complete search history.

(56) References Cited

U.S. PATENT DOCUMENTS

| | | | |
|---|---|---|---|
| 5,497,119 A | 3/1996 | Tedrow et al. | |
| 5,509,134 A | 4/1996 | Fandrich et al. | |
| 5,546,042 A | 8/1996 | Tedrow et al. | |
| 5,615,165 A | 3/1997 | Tanaka et al. | |
| 5,757,699 A * | 5/1998 | Takeshima et al. | 365/185.24 |
| 5,765,184 A | 6/1998 | Durante | |
| 5,809,541 A | 9/1998 | Fandrich et al. | |
| 5,937,424 A | 8/1999 | Leak et al. | |
| 6,134,140 A | 10/2000 | Tanaka et al. | |
| 6,282,145 B1 | 8/2001 | Tran et al. | |
| 2006/0028875 A1 * | 2/2006 | Avraham et al. | 365/185.24 |

* cited by examiner

*Primary Examiner*—Richard T. Elms
*Assistant Examiner*—Allison Bernstein
(74) *Attorney, Agent, or Firm*—Sawyer Law Group LLP

(57) ABSTRACT

Aspects for programming a nonvolatile electronic device include performing an initial verify step of a programming algorithm with an initial type of reference voltage value, and performing one or more subsequent verify steps in the programming algorithm with a second type of reference voltage value. Further included is utilizing a read reference voltage for the initial verify step, wherein desired programming is ensured for a cell that falls out of ideal distribution.

15 Claims, 2 Drawing Sheets

| | |
|---|---|
| Vte | threshold of erase reference |
| Vtp0, Vtp1, Vtp2 | thresholds of program verify references |
| Vtr0, Vtr1, Vtr2 | thresholds of read references |

METHOD AND SYSTEM FOR A PROGRAMMING APPROACH FOR A NONVOLATILE ELECTRONIC DEVICE

CROSS-REFERENCE TO RELATED APPLICATIONS

This application claims benefit under 35 USC 119, of Italian Application no. MI2004A 001904, filed on Oct. 7, 2004.

FIELD OF THE INVENTION

The present invention relates to a programming approach for a nonvolatile electronic device, such as flash memory, that ensures a desired final destination for a cell is reached even when a cell may not be in an ideal distribution.

BACKGROUND OF THE INVENTION

Logical information associated with a flash memory cell is related to its physical size. In a single level device, a cell is said to be erased (logic level "1") when few electrons are stored in the floating gate. Vice versa, a cell is said to be programmed (logic level "0") when 'enough' electrons are stored in the floating gate. Depending on how many electrons are trapped in the floating gate, the gate threshold of the cell changes (i.e., when more electrons are trapped, the threshold is higher). Endurance and retention are two parameters often used to describe the quality of a flash memory cell. Endurance refers to the capability of the cell to maintain stored information after erase/program/read cycling, while retention refers to the capability of a cell to keep stored information over time.

In single level flash memory, each cell after a modify operation has a threshold higher than a program voltage threshold, Vtp, or lower than an erase voltage threshold, Vte. By comparing the current sunk from a read cell and a reference driven in the same condition, the information of the selected cell is established. A light endurance problem exists if some programmed cells lose a little charge from the floating gate. However, if these cells assume a threshold slightly lower than Vtp but higher enough of Vt_read, flash functionality is still good. If a cell is in this condition and programming is required on it, the program verify is better with a reference with a threshold Vtp. In this case, the cell will be verified as a logical "1" (it has a threshold lower than the reference Vtp used), and so it will be programmed. After this operation, the cell will have a threshold higher of Vtp and this means that the cell has been recovered. This operation is not user visible. In fact, if, before programming, the user reads the cell, the cell is evaluated as programmed. However, by using Vtp as reference of the verify, the cell is recovered and the recovery has no drawbacks.

In a multilevel flash device, the situation is not the same, and the choice of reference for verify before programming is more complex and can cause wrong operations in the case of cells with a threshold not exactly inside target distributions.

The threshold situation for multilevel flash memory cells is represented by the graph 100 shown in FIG. 1. In this case, the number of electrons trapped in the floating gate of the cell is controlled in a way that permits four distributions associated with four logical values, "11", "10", "01", and "00". Three different Vtp levels, Vtp0, Vtp1, Vtp2, represent three different ideal minimum values of the three distributions, "10", "01", and "00". For read access, three references are also used with an appropriate margin between each level.

For the physical situation of distribution in a multilevel flash memory, a program algorithm can "move" the threshold of a cell towards higher values. Thus, it is physically possible to move a cell from distribution "11" to "10" or from "10" to "01" or from "11" to "00". It is not physically permitted to move from "01" to "10", for example. A possible program algorithm can follow the physics of the memory. Thus, if a user gives a pattern "01" on a cell in "10" distribution, the operation is physically correct and the final destination of the selected cell will be "01". On the other hand, if a cell is in "01" and the user gives as a desired pattern "10", this is not a physically correct request and the algorithm will not move the threshold of the cell.

Thus, for a physical approach to programming of a cell, the final destination of the cell will coincide always with the pattern (data to program) desired if the transition is physically possible. Otherwise, the cell will not be programmed at all. This is true for single level cells, as well. Under this approach, since the final destination coincides with the pattern required if a modify occurs, the first verify step before programming has to establish the absolute pattern on the selected cell. The best way to establish this position is to use Vtp0, Vtp1, and Vtp2. In this way, if a cell is slightly out of distribution, it will be correctly recovered.

For physical approaches, software written for use with single level cells has to be changed if multilevel cells are substituted. As an example, if a user gives a pattern "01" in a single level flash device, this refers to two cells of memory with each cell being treated separately as single level cells. If these two cells are in "10" condition, to reach a pattern "01," a pattern of "1" is required on a cell "0", which is not physically possible. The transition of the cell is left at its original position of "0". On the other cell, the pattern required is "0" on a "1" cell, which is possible. Thus, the final destination will be "0". The overall result is that with a starting situation "10" and a required pattern "01", the actual final destination is "00". In contrast, for a multilevel cell in "10", the required pattern "01" will be the final destination, as this is a possible transition. A graph 200 of FIG. 2 illustrates an initial cell position of "10" and a final cell position of the required pattern "01".

Another approach to programming permits the management of single level and multilevel flash by the same software. This approach is referred to as a "logical" approach. Under this approach, even if flash has a multilevel structure, the user can use it as a single level one. If a pattern is given to program a bit at "1", the corresponding bit does not need to be modified. If a pattern is given to program a bit to "0", the corresponding bit has to be "0" after programming. Thus, if a cell is in distribution "10" and the pattern to program is "01", the requested final distribution of the cell is "00". If the cell is in distribution "01" and the pattern to program is "10", the final position of the cell has to be "00". Graph 210 of FIG. 2 illustrates the initial to final position by the solid arrow, where the dashed arrow indicates the unallowed transition from "10" to "01".

Many different methods to program cells are known in the prior art that try to move cell thresholds with a high precision and with a relatively fast execution time. As mentioned previously, physical approaches require dedicated software for each of single level and multilevel devices. Logical approaches use the same programming for single and multilevel devices. However, these prior art logical approaches assume that cells are in their ideal distributions (i.e., there is no retention problem). When there is a light charge losing and some cells are lightly out of their distributions, the device can work correctly but programming on these cells can fail.

Accordingly, a need exists for a programming approach that ensures a desired final destination for a cell is reached even when a cell may not be in an ideal distribution. The present invention addresses such a need.

BRIEF SUMMARY OF THE INVENTION

Aspects for programming a nonvolatile electronic device are described. The aspects include performing an initial verify step of a programming algorithm with an initial type of reference voltage value, and performing one or more subsequent verify steps in the programming algorithm with a second type of reference voltage value. Further included is utilizing a read reference voltage for the initial verify step.

Through the present invention, a straightforward and effective logical approach to programming is achieved that ensures desired programming for a cell that falls out of ideal distribution. These and other advantages of the aspects of the present invention will be more fully understood in conjunction with the following detailed description and accompanying drawings.

DETAILED DESCRIPTION OF THE INVENTION

The present invention relates to a programming approach for a nonvolatile electronic device. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiments shown but is to be accorded the widest scope consistent with the principles and features described herein.

Figure 3:
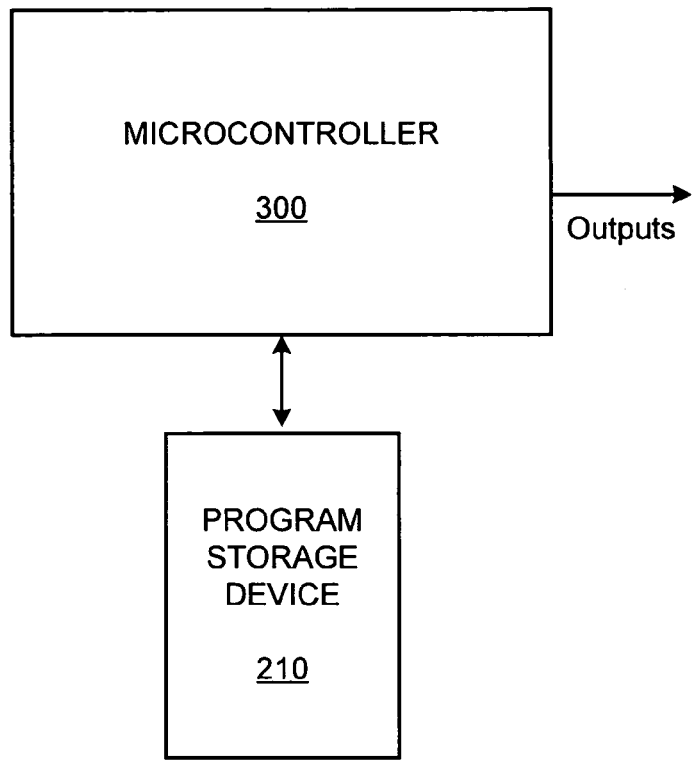
FIG. 3 illustrates a block diagram of a system for programming in accordance with the present invention.

In accordance with the present invention, a programming approach for a nonvolatile electronic device, such as flash memory, is provided that ensures a desired final destination for a cell is reached even when a cell may not be in an ideal distribution. In order to perform the programming, a microcontroller is used in a flash memory to manage modify operations, including programming. Referring to FIG. 3, a basic block diagram of a system for programming in accordance with the present invention is shown. As shown, the microcontroller 300 drives several different blocks (not shown), including pumps, regulators, address and time counters, switches, etc., by executing instructions of an algorithm written in a program storage device 310, e.g., an embedded ROM (or SRAM), and setting opportune outputs, as is well understood in the art.

In a traditional approach to programming, a user read access is made by read reference voltage values (Vr0, Vr1, Vr2), but first verify is made by setting program reference voltage values (Vp0, Vp1, Vp2). The information evaluated after these two accesses will coincide if all cells are within ideal distributions. In this case, if a cell in fact has, for example, a threshold higher than Vr0, the threshold will also be higher than Vp0. However, if a cell is not in an ideal distribution, e.g., it has lost retention of a little charge, the user evaluation can differ from the microcontroller first verify, and the final destination could be different from that expected by a user.

Figure 4:
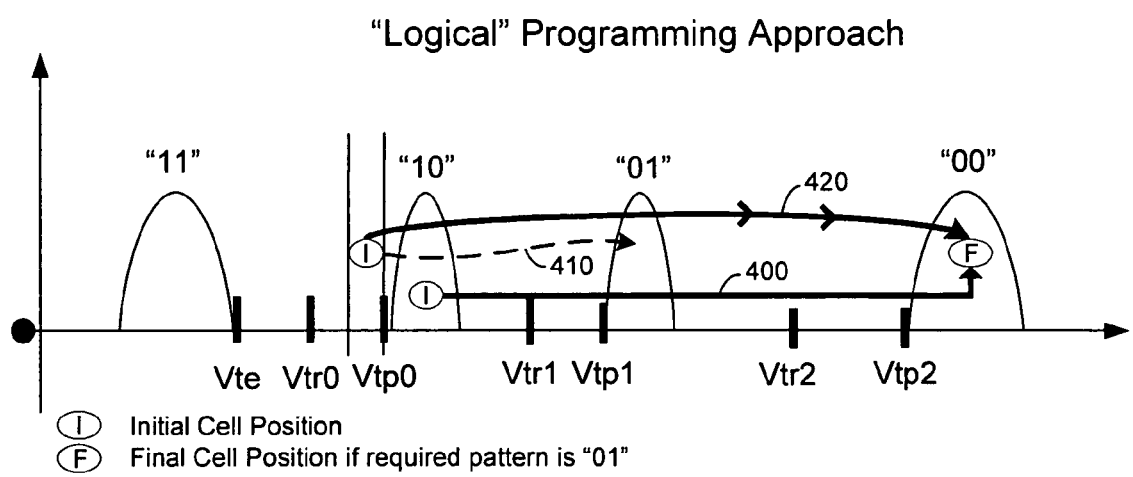
FIG. 4 illustrates a graph of transitions for a cell outside of ideal distribution in a logical approach to programming, including the transition occurring as a result of the present invention.

The following example shows a wrong programming if not all distributions are ideal, i.e., if some cells lose a little charge, and the traditional approach is used. Referring to FIG. 4, a cell has a threshold slightly lower than Vtp0 but higher than Vtr0. If a user makes a read access on the cell, the associated information established is "10". This happens because read references Vr0, Vr1, and Vr2 are used and the selected cell has a threshold higher than Vr0 but lower of Vr1 and Vr2. If the user wants to program the cell to "00", the pattern chosen is "01". At this point, the user starts programming and thinks the "00" information is obtained at the end of programming, i.e., that the transition indicated by arrow 400 has occurred. Unfortunately, the result is different if the algorithm executes the traditional approach, where the first verify is made using Vp0, Vp1, and Vp2.

When the first verify is made using Vp0, Vp1, and Vp2, the cell is, in fact, evaluated to be in "11" distribution as its threshold is lower than Vtp0. As pattern chosen by user is "01", the final destination of the cell will be "01" and not "00" as hoped by the user. The wrong transition is shown by arrow 410 in FIG. 4 and demonstrates this 'wrong' final destination.

Figure 1:
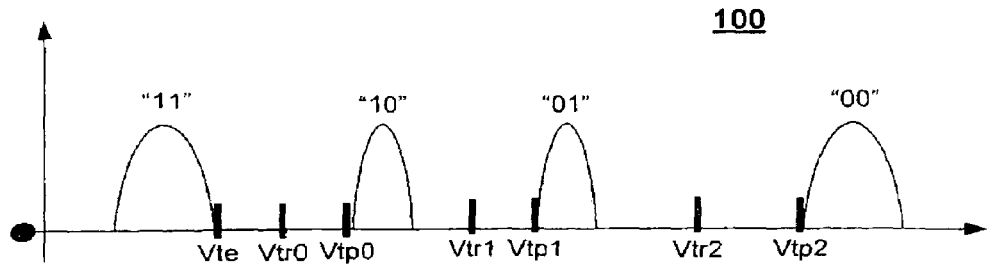
FIG. 1 illustrates a graph of multilevel flash memory distributions of the prior art.
Figure 2:
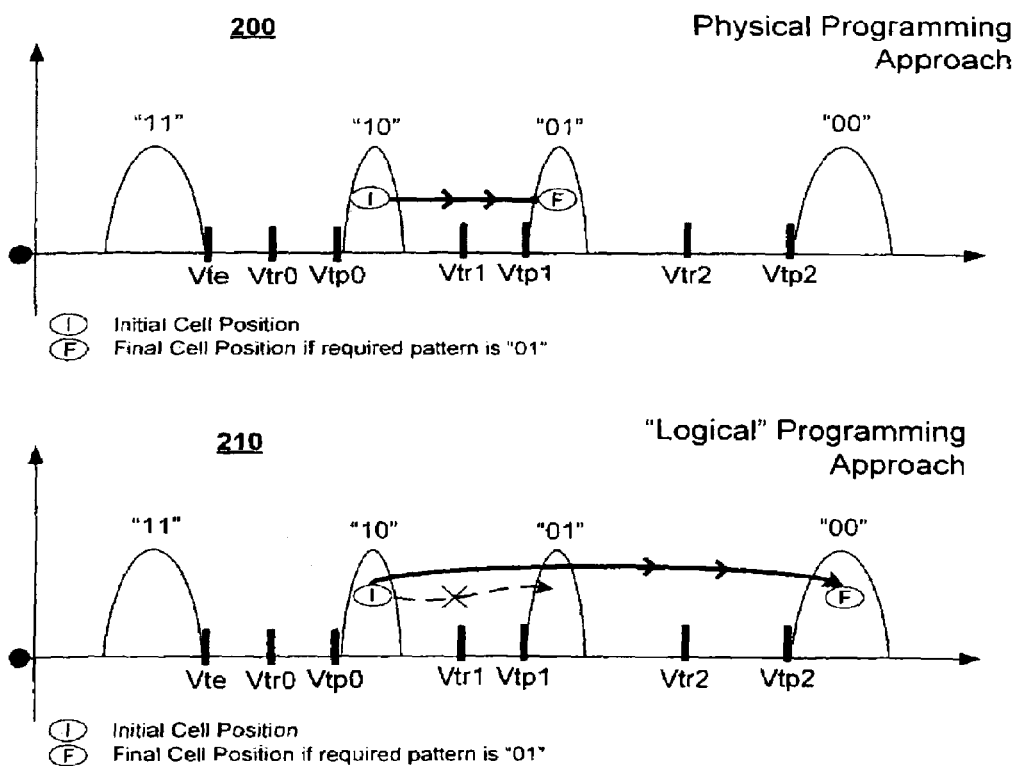
FIG. 2 illustrates graphs of physical and logical approaches to programming flash memory cells of the prior art.

In accordance with the present invention, the first verify in the programming algorithm stored on device 210 (FIG. 2) is managed differently than the first verify of the prior art in order to obtain exactly what the user expects from programming. Since the user decides the final destination giving a pattern established after a read access, the present invention matches user desired programming by executing a first verify with read references (Vtr0, Vtr1, and Vtr2). Once the final destination of each cell is established, all other verify steps are done in the same manner as in the traditional approach in order to assure a good distribution matching. In the described example of the cell in FIG. 4, final destination of the cell will be correctly "00", which is shown by correct transition arrow 420 in FIG. 4, as a consequence of the given pattern "01" and a first verify step based on Vtr0, which indicates the initial cell position to be "10".

It should be appreciated that the example described for FIG. 4 provides one example but is not restrictive of other possible cases. Further, after correct final decision has been taken, other program verifies have to be made by program references in order to obtain a correct position of the cell inside distribution. After the 'key' first verify, the algorithm can follow one of the methods known in the prior art as desired regarding multilevel flash memory programming. Thus, the present invention provides a straightforward and effective logical approach to programming that ensures desired programming for a cell that falls out of ideal distribution.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

We claim:

1. A method for programming a nonvolatile electronic device, the method comprising:
    performing an initial verify step of a programming algorithm with read reference voltage value; and
    performing one or more subsequent verify steps in the programming algorithm with a second type of reference voltage value.

2. The method of claim 1 wherein the second type of reference voltage value comprises a program reference voltage value.

3. The method of claim 1 wherein performing the initial verify step ensures a cell not in an ideal distribution reaches a desired final destination.

4. The method of claim 1 further comprising utilizing the programming steps for a logical approach to programming multilevel nonvolatile electronic devices.

5. The method of claim 1 wherein the nonvolatile electronic devices comprise multilevel flash memory devices.

6. A system for programming a nonvolatile electronic device, the system comprising:
    a program storage device for storing a programming algorithm for nonvolatile electronic devices; and
    a microcontroller coupled to the program storage device, the microcontroller controlling execution of the programming algorithm, including performing an initial verify step of a programming algorithm with read reference voltage value, and performing one or more subsequent verify steps in the programming algorithm with a second type of reference voltage value.

7. The system of claim 6 wherein the second type of reference voltage value comprises a program reference voltage value.

8. The system of claim 6 wherein the initial verify step ensures a cell not in exact distribution reaches a desired final destination.

9. The system of claim 6 wherein the nonvolatile electronic devices comprise multilevel flash memory devices.

10. The system of claim 6 wherein the programming algorithm further comprises a logical approach programming algorithm.

11. A method for programming a nonvolatile electronic device, the method comprising:
    utilizing a read reference voltage for a verify step in a programming algorithm, wherein desired programming is ensured for a cell that falls out of ideal distribution.

12. The method of claim 11 wherein utilizing a read reference for a verify step further comprises utilizing a read reference voltage for a first verify step of the programming algorithm.

13. The method of claim 12 further comprising utilizing a program reference voltage for at least one second verify step in the programming algorithm.

14. The method of claim 11 further comprising utilizing the programming algorithm as a logical approach to programming multilevel flash memory devices.

15. The method of claim 11 wherein a read reference voltage further comprises a voltage level used for a read access in the programming algorithm.

* * * * *